(12) United States Patent
Han et al.

(10) Patent No.: US 10,193,540 B1
(45) Date of Patent: Jan. 29, 2019

(54) LOW-POWER DECISION THRESHOLD CONTROL FOR HIGH-SPEED SIGNALING

(71) Applicant: Xilinx, Inc., San Jose, CA (US)

(72) Inventors: Jaeduk Han, Albany, CA (US); Hsung Jai Im, San Jose, CA (US)

(73) Assignee: XILINX, INC., San Jose, CA (US)

(*) Notice: Subject to any disclaimer, the term of this patent is extended or adjusted under 35 U.S.C. 154(b) by 15 days.

(21) Appl. No.: 15/410,566

(22) Filed: Jan. 19, 2017

(51) Int. Cl.
*H03K 7/02* (2006.01)
*H04L 25/49* (2006.01)
*H03K 5/125* (2006.01)

(52) U.S. Cl.
CPC ............... *H03K 7/02* (2013.01); *H03K 5/125* (2013.01); *H04L 25/4917* (2013.01)

(58) Field of Classification Search
CPC ....... H03K 7/02; H03K 5/125; H04L 25/4917
See application file for complete search history.

(56) References Cited

U.S. PATENT DOCUMENTS

| 4,851,786 | A | * | 7/1989 | Vinn | H03F 3/45363 330/252 |
|---|---|---|---|---|---|
| 5,287,071 | A | * | 2/1994 | Olmstead | H03F 3/45183 330/257 |
| 5,873,046 | A | * | 2/1999 | Bronner | H04B 1/406 455/226.2 |
| 7,236,004 | B1 | | 6/2007 | Zhou et al. | |
| 8,395,446 | B1 | | 3/2013 | Tran | |
| 9,250,694 | B1 | * | 2/2016 | Kotikalapoodi | G06F 1/26 |
| 2005/0134371 | A1 | * | 6/2005 | Glass | H03F 3/45475 330/9 |
| 2011/0227642 | A1 | * | 9/2011 | Hoyerby | H03F 1/32 330/109 |

* cited by examiner

*Primary Examiner* — Freshteh N Aghdam
(74) *Attorney, Agent, or Firm* — W. Eric Webostad

(57) ABSTRACT

An apparatus and method and system therefor relates generally to decision threshold control. In such an apparatus, an ac-coupler circuit is configured as a high-pass circuit path for a first frequency range. A buffer amplifier circuit is coupled in parallel with the ac-coupler circuit. The buffer amplifier circuit is configured as a low-pass circuit path for a second frequency range. An offset injection circuit is coupled to both the ac-coupler circuit and the buffer amplifier circuit and configured to inject an offset.

17 Claims, 9 Drawing Sheets

LOW-POWER DECISION THRESHOLD CONTROL FOR HIGH-SPEED SIGNALING

FIELD OF THE INVENTION

The following description relates to integrated circuit devices ("ICs"). More particularly, the following description relates to low-power decision threshold control for high-speed signaling for an IC.

BACKGROUND

In high speed receiver systems, decision devices, such as samplers or slicers, are used to detect symbols in a received signal. A threshold may be set in such decision devices for determining which symbol is received. For multi-level signaling, multiple samplers with different decision thresholds may detect multiple symbols modulated in multi-level signals. As there may be many of such samplers on an IC, power consumption by such samplers is a significant issue. Hence, it is desirable to provide an IC having reduced power consumption.

SUMMARY

An apparatus relates generally to decision threshold control. In such an apparatus, an ac-coupler circuit is configured as a high-pass circuit path for a first frequency range. A buffer amplifier circuit is coupled in parallel with the ac-coupler circuit. The buffer amplifier circuit is configured as a low-pass circuit path for a second frequency range. An offset injection circuit is coupled to both the ac-coupler circuit and the buffer amplifier circuit and configured to inject an offset.

A system relates generally to signal sampling. In such a system, a sampler is configured to receive a signal and to detect symbols in the received signal. A decision threshold control circuit of the sampler includes a bi-modal differential amplifier. The bi-modal differential amplifier has a current amplifier circuit and an offset injection circuit coupled to one another at voltage output nodes. The current amplifier circuit has voltage input nodes for receiving the received signal. The offset injection circuit is configured to receive an offset input voltage.

A method relates generally to decision threshold control. In such a method, a differential input signal is sampled at a sampling frequency to detect symbols in the differential input signal. The symbols detected from the sampling are output. The sampling includes: providing an offset voltage input to an offset injection circuit to set a threshold level for the sampling, the offset voltage input independent of a high-pass range and a low-pass range; inputting the differential input signal to input voltage nodes of a buffer amplifier circuit and an ac-coupler circuit coupled in parallel with one another between the input voltage nodes and output voltage nodes; and bypassing the buffer amplifier circuit by the ac-coupler circuit for the high-pass range including directly conducting the differential input signal from the input voltage nodes to the output voltage nodes through the ac-coupler circuit.

Other features will be recognized from consideration of the Detailed Description and Claims, which follow.

BRIEF DESCRIPTION OF THE DRAWINGS

Accompanying drawings show exemplary apparatus(es) and/or method(s). However, the accompanying drawings should not be taken to limit the scope of the claims, but are for explanation and understanding only.

FIG. 1-2 is a block diagram illustratively depicting an exemplary pulse amplitude modulation-4 ("PAM4") sampler.

FIG. 1-3 is a block diagram illustratively depicting an exemplary error sampler.

FIG. 2 is a schematic diagram illustratively depicting an exemplary conventional differential amplifier.

FIG. 3 is a signal diagram illustratively depicting an exemplary frequency response for the differential amplifier of FIG. 2.

DETAILED DESCRIPTION

In the following description, numerous specific details are set forth to provide a more thorough description of the specific examples described herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Exemplary apparatus(es) and/or method(s) are described herein. It should be understood that the word "exemplary" is used herein to mean "serving as an example, instance, or illustration." Any example or feature described herein as "exemplary" is not necessarily to be construed as preferred or advantageous over other examples or features.

Before describing the examples illustratively depicted in the several figures, a general introduction is provided to further understanding.

For multi-level signals, multiple samplers are used with multiple decision thresholds for detecting symbols in a received multi-level signal. There may be many samplers on an IC die, and such samplers may consume a significant amount of power.

As described below in additional detail, a differential amplifier may be implemented as a low-power decision threshold control circuit for a sampler. Along those lines, a buffer amplifier circuit and an alternating current coupler ("ac-coupler") circuit are coupled in parallel, so the former controls during a low-frequency range and the latter controls during a high-frequency range.

With the above general understanding borne in mind, various configurations for a low-power decision control circuit for high-speed signaling are generally described below.

Figure 1:
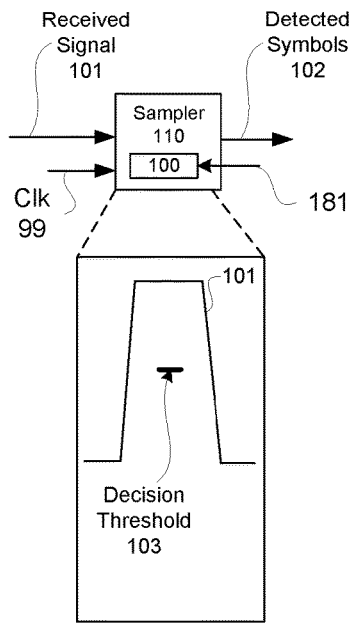
FIG. 1-1 is a block diagram illustratively depicting an exemplary sampler or slicer.

FIG. 1-1 is a block diagram illustratively depicting an exemplary sampler or slicer 110. Sampler 110 is conventionally clocked with a sampling clock signal 99. Sampling clock signal 99 has a sampling frequency, fs.

Sampler 110 may be coupled to receive received signal 101 as an input. Sampler 110 may be configured with a decision threshold control circuit 100 to provide detected symbols 102 detected in such received signal 101. Sampler 110 may be configured with a fixed or adjustable decision threshold ("Vth") 103. A reference voltage input 181 to sampler 110 may be used for setting such a decision threshold 103.

For received signal 101 encoded as a non-return-to-zero ("NRZ") signal, decision threshold 103 may be set equal to or just above or below a zero volt threshold amplitude for received signal 101. A pulse-amplitude-modulation ("PAM") encoding of received signal 101 may be use with such an NRZ signaling. Accordingly, amplitude values of received signal 101 above such decision threshold 103 may be output as logic high symbols, and amplitude values of received signal 101 below such decision threshold 103 may be output as logic low symbols.

Figures 1, 2:
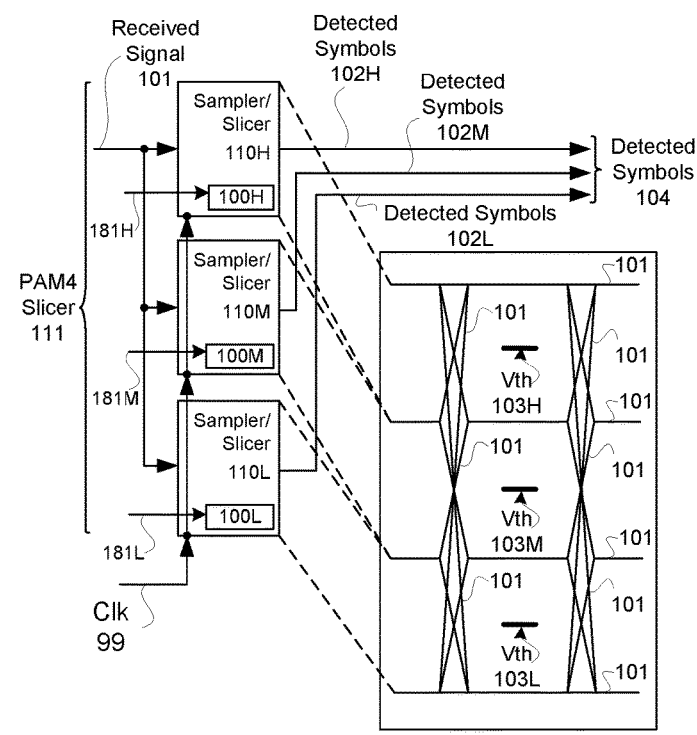

FIG. 1-2 is a block diagram illustratively depicting an exemplary PAM4 slicer or sampler 111. PAM4 sampler 111 may have three samplers 110H, 110M, and 110L for a high voltage level decision threshold 103H, a medium voltage level decision threshold 103M, and a low voltage level decision threshold 103L, respectively. Again, samplers 103H, 103M, and 103L are conventionally each clocked with a same sampling clock signal 99.

Samplers 103H, 103M, and 103L may be commonly coupled to receive as an input a received signal 101. Samplers 103H, 103M and 103L may be respectively configured with decision threshold control circuits 100H, 100M and 100L to provide high voltage level detected symbols 102H, medium voltage level detected symbols 102M and low voltage level detected symbols 102L, respectively. Detected symbols 102H, 102M and 102L may collectively form as a PAM4 detected symbols output 104 detected in such received signal 101.

Samplers 110H, 110M and/or 110L may be configured with respective fixed or adjustable decision thresholds ("Vth") 103H, 103M and/or 103L, respectively. Respective reference voltage inputs 181H, 181M and 181L to samplers 110H, 110M and 110L may be used for setting such decision thresholds 103H, 103M and 103L. For PAM4 encoding of received signal 101, NRZ signaling may be used as is known. Accordingly, amplitude values of received signal 101 falling above decision threshold 103H may be output as logic level 3 symbols. Amplitude values of received signal 101 below decision threshold 103H and above decision threshold 103M may be output as logic level 2 symbols Amplitude values of received signal 101 falling below decision threshold 103M and above decision threshold 103L may be output as logic level 1 symbols. Amplitude values of received signal 101 falling below decision threshold 103L may be output as logic level 0 symbols.

Figures 1, 2, 3:
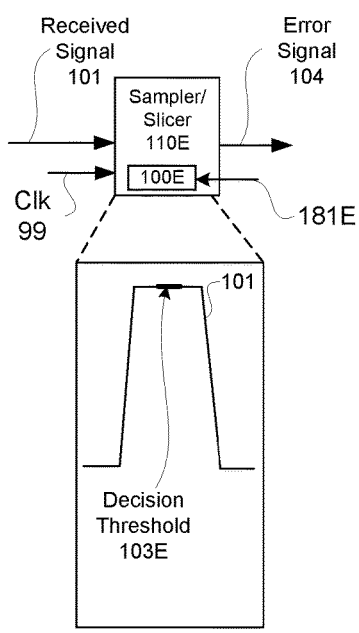
Figure 2:
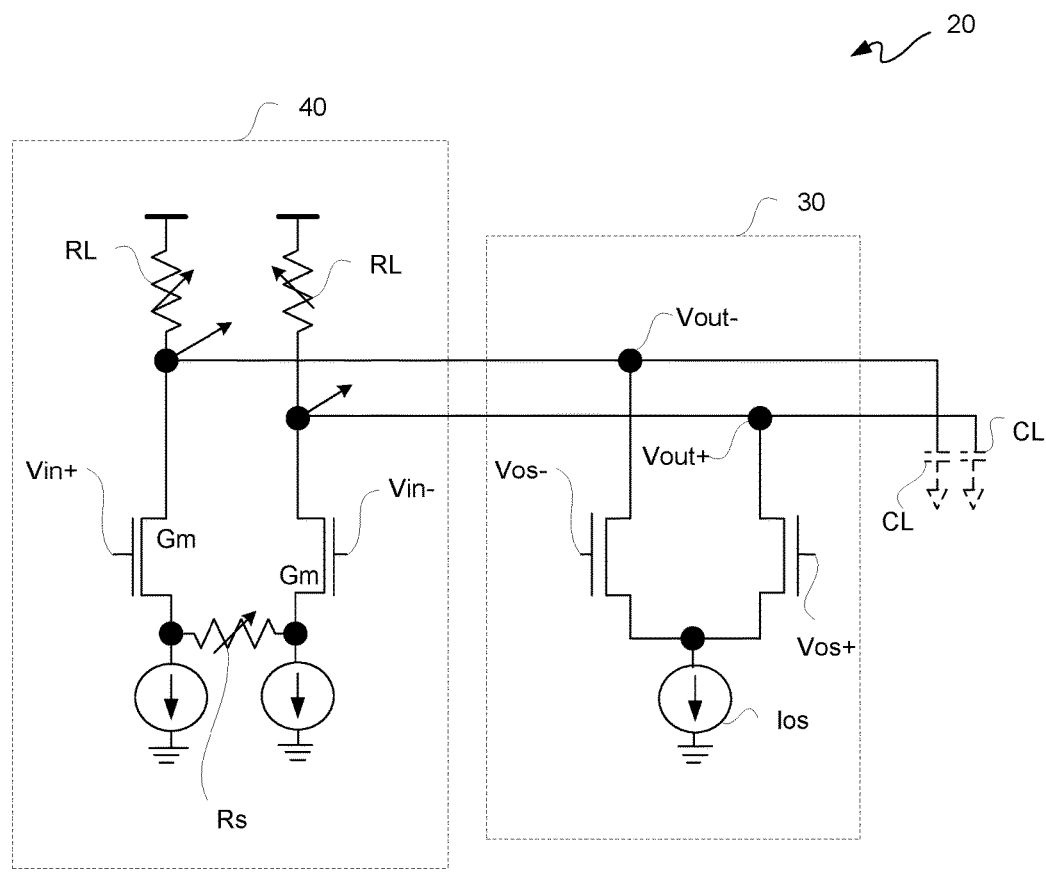
Figure 3:
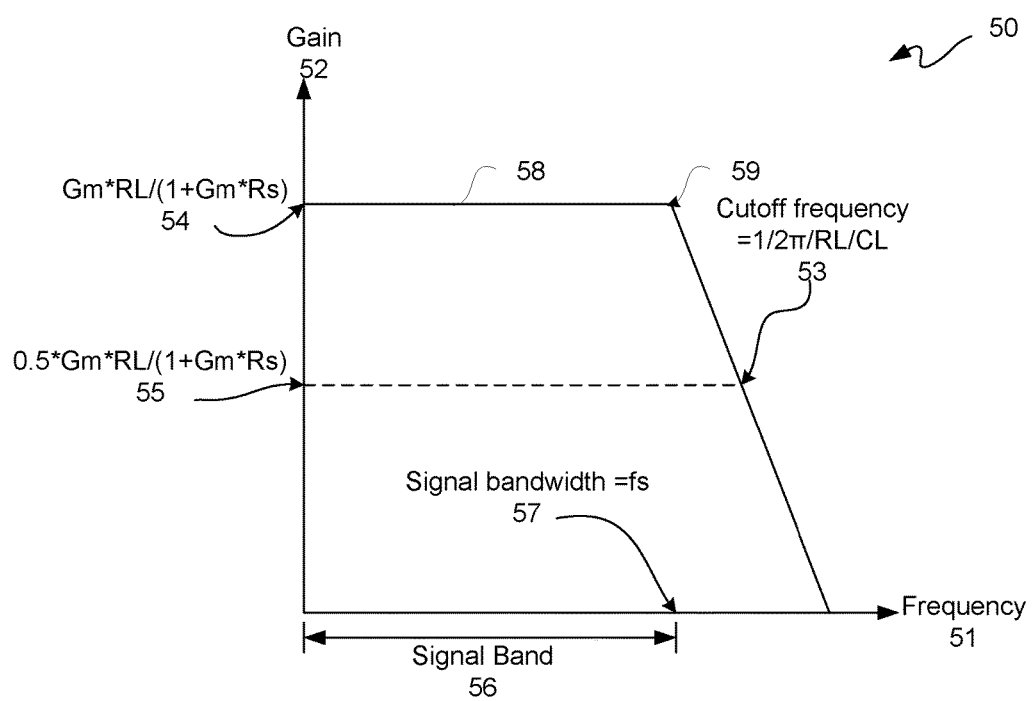

FIG. 1-3 is a block diagram illustratively depicting an exemplary error sampler 110E. Error sampler 110E is conventionally clocked with a sampling clock signal 99.

Error sampler 110E may be coupled to receive as an input a received signal 101. Error sampler 110E may be configured with a decision threshold control circuit 100E to provide an error signal 104 with detected errors associated with such received signal 101. Sampler 110E may be configured with a fixed or adjustable decision threshold ("Vth") 103E. A reference voltage input 181E to error sampler 110E may be used for setting such a decision threshold 103E. A decision threshold 103E may be set equal to a logic level, which in this example is a logic high voltage level, to determine whether such a decision threshold 103E is appropriate for sampling or slicing data from received signal 101 at such logic level.

Along those lines, error signal 104 may be used to adapt, calibrate or otherwise adjust a decision threshold of PAM sampler 110 of FIG. 1-1 or PAM4 sampler 111 of FIG. 102. In other words, error sampler 110E may be implemented as a decision threshold control circuit or as a signal level estimator for equalizer adaptation, as error sampler 110E samples a difference between an estimated signal level, namely decision threshold 103E, and an actual signal level of received signal 101.

FIG. 2 is a schematic diagram illustratively depicting an exemplary conventional differential amplifier 20. Differential amplifier 20 may be a current mode logic ("CML") differential amplifier. Differential amplifier 20 may include a current amplifier circuit ("gain stage") 40 and a current injection circuit ("offset stage") 30.

FIG. 3 is a signal diagram illustratively depicting an exemplary frequency response 50 for differential amplifier 20 of FIG. 2. Frequency response 50 is plotted as frequency along an x-axis 51 versus gain along a y-axis 52. Generally, gain may be thought of as a ratio of output voltage Vout to input voltage Vin.

A maximum gain 54 may be determined from the following equation $Gm*RL/(1+Gm*RS)$, where Gm is transconductance of a transistor of gain stage 40 of differential amplifier 20, RL is resistance of a load resistance of gain stage 40 of differential amplifier 20, and Rs is resistance of gain stage 40 of differential amplifier 20. A cutoff frequency 53 may be determined from the following equation $½π RL/CL$, where RL is resistance of load resistance of gain stage 40 of differential amplifier 20, and where CL is capacitance of load capacitance of differential amplifier 20. Generally, bandwidth of an amplifier is defined to be the frequency at which the gain drops to $1/\sqrt{2}$ of DC (or flat-band) gain. Gain at cutoff frequency ("cutoff gain") 55 may be determined from the following equation $(1/\sqrt{2})*Gm*RL/(1+Gm*Rs)$, where Gm is transconductance of a transistor of gain stage 40 of differential amplifier 20, RL is resistance of a load resistance of gain stage 40 of differential amplifier 20, and Rs is resistance of gain stage 40 of differential amplifier 20.

Within a frequency-gain curve 58, a gain for a frequency range is to be maintained. In this example, a highest frequency of a signal band 56 is equal to sampling frequency fs 57, such as a frequency of a clock signal provided to samplers of FIGS. 1-1 through 1-3. A frequency range for which gain is maintained is signal band 56. A signal band 56 is a frequency range for a signal of interest, such as a frequency of a differential input signal provided to differential amplifier 20. Cutoff frequency 53 is higher in frequency than a highest frequency of a signal band 56, namely a sampling frequency 57.

Differential amplifier 20 may be implemented as a decision threshold control circuit with offset injection branches for a sampler of any of samplers 110 of FIGS. 1-1 through 1-3. Along those lines, a decision threshold of differential amplifier 20 may be charged up to $Ios*RL/Gm/RL*(1+$ Gm*Rs)=Ios/Gm*(1+Gm Rs), depending on values for offset voltages Vos− and Vos+, where Ios is an offset current of offset stage 30.

However, it was observed that a high bandwidth differential amplifier 20 consumes a significant amount of power when knee 59 of frequency-gain curve 58 is at a higher frequency than sampling frequency 57. More particularly, it was observed that a high bandwidth differential amplifier 20 when not used to attenuate a signal, just having such attenuation capability consumes a significant amount of power during high-frequency operation of differential amplifier 20. In other words, conventional decision threshold control circuits using differential amplifier 20 means that differential amplifier 20 has to have a large high bandwidth to cover an entire bandwidth of input differential signals, which results in significant power consumption.

As described below in additional detail, a bi-modal differential amplifier with a low-frequency or transconductance mode and a high-frequency or bypass mode, where such bi-modal differential amplifier consumes less power in comparison to differential amplifier 20 may be used to reduce power consumption as compared to a conventional differential amplifier. Along those lines, a frequency range from 0 or DC to a high-frequency target, which frequency range is continuous, is provided by such a hybrid differential amplifier. In the past, both low- and high-frequency signals were processed by a high-power differential amplifier.

Figure 4:
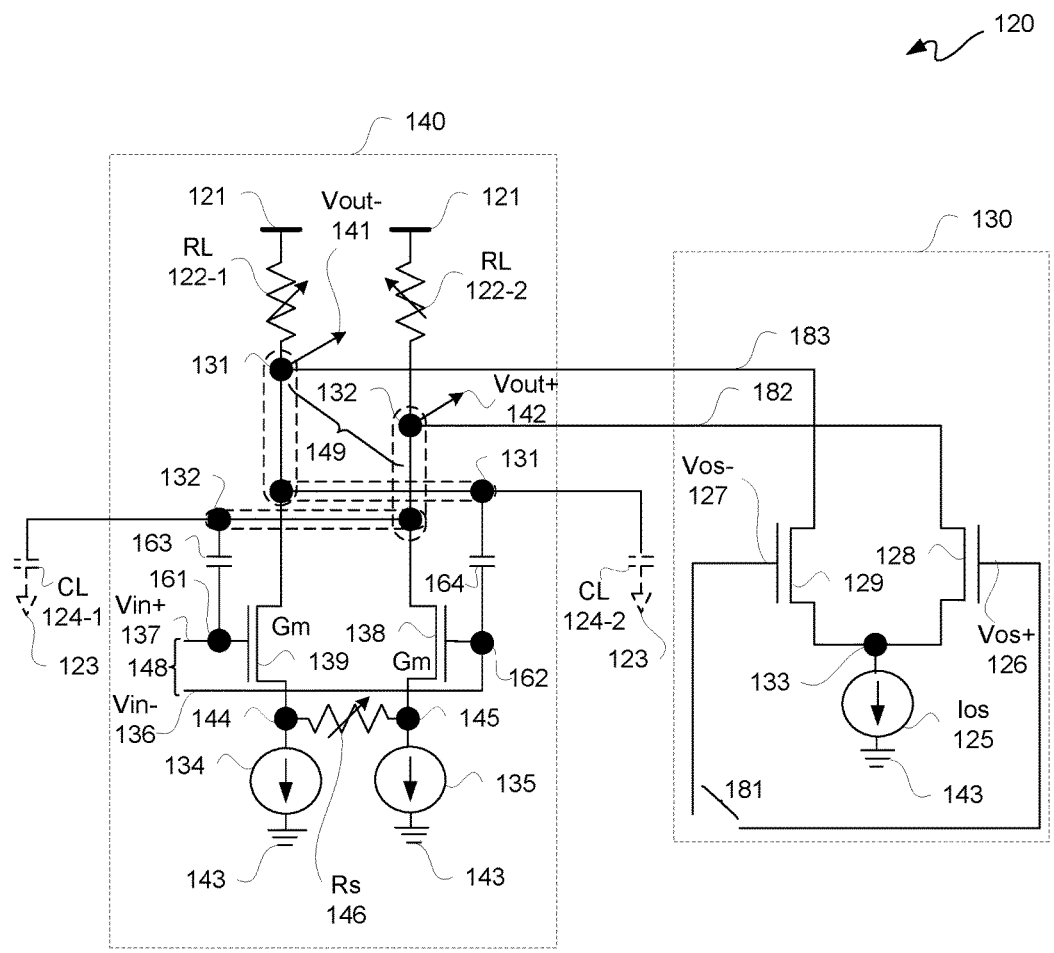
FIG. 4 is a schematic diagram illustratively depicting an exemplary bi-modal differential amplifier.

To mitigate this problem, a hybrid decision threshold control circuit described below may be used. FIG. 4 is a schematic diagram illustratively depicting an exemplary bi-modal differential amplifier 120. Differential amplifier 120 may be a current mode logic ("CML") differential amplifier. Differential amplifier 120 may include a current amplifier circuit ("gain stage") 140 and a current injection circuit ("offset stage") 130. Differential amplifier 120 may be used for a decision threshold control circuit.

For gain stage 140, a differential input signal 148 having a positive input voltage rail ("Vin+") 137 and a negative input voltage rail ("Vin−") 136 are respectively applied to a gate node 161 of transistor 139 and a gate node 162 of transistor 138. An ac-coupling capacitor 163 is coupled between gate node 161 and output node 132, and an ac-coupling capacitor 164 is coupled between gate node 162 and output node 131. In this example, all transistors are NMOS transistors; however, in this or another implementation PMOS transistors may be used.

A source region of transistor 139 is coupled to a degeneration or source node 144, and a source region of transistor 138 is coupled to a degeneration or source node 145. A drain region of transistor 139 is coupled to an output node 131, and a drain region of transistor 138 is coupled to an output node 132.

Continuing the description of gain stage 140, a current source 134 is coupled between an amplifier Vss ("amplifier ground") 143 and source node 144, and a current source 135 is coupled between amplifier ground 143 and source node 145. Effectively, amperage of current, $I_{amp}$, through each of current sources 134 and 135 may be $I_{amp}/2$.

A degeneration or source resistance ("Rs") 146 is coupled between source nodes 144 and 145. Rs 146 may be implemented as a fixed resistor for a fixed gain or an adjustable or programmable resistor for an adjustable gain, the latter of which is illustratively depicted. If Rs 146 were to represent as a short between source nodes 144 and 145, namely zero resistance, then a maximum gain of transistors 138 and 139 may be obtained. However, a maximum gain may not be sufficiently stable for some applications, and so a resistance may be provided by Rs 146 to adjust gain of transistors 138 and 139 to be below such a maximum gain.

Continuing the description of gain stage 140, during operation a differential voltage input signal 148 is provided to gates of transistors 138 and 139, and a positive rail voltage Vin+ 137 and a negative rail voltage Vin− 136 of such differential voltage input signal 148 are used to cause transistors 139 and 138 to respectively transconduct corresponding output currents to output nodes 131 and 132, respectively.

Transconductance, Gm, of each of transistors 136 and 137 may be designed to be matched, but in actual implementation may be mismatched. Transconductance mismatch and/or other extrinsic factors may cause an imbalance between a differential voltage output signal 149 on output nodes 131 and 132, which may be compensated for as described below. It should be understood that for NRZ signaling or other negative voltage signaling, whether for PAM, PAM4 or another type of symbol encoding, that Vin+ 137 may be a positive or negative voltage delivered on what is considered a positive side or positive rail, and that Vin− 136 may be a positive or negative voltage delivered on what is considered a negative side or negative rail.

Continuing the description of gain stage 140, a resistive load 122-1 may be coupled between output node 131 and a supply voltage node 121, and a resistive load 122-2 may be coupled between output node 132 and supply voltage node 121. Resistive loads 122-1 and 122-2 may be fixed resistors or programmable or adjustable resistors, the latter of which is illustratively depicted. Output currents transconducted to output nodes 131 and 132 responsive to rail voltages of a differential input signal 148, respectively, are converted to a negative side output voltage ("Vout−") 141 on output node 131 and a positive side output voltage ("Vout+") 142 on output node 132. Along those lines, positive and negative sides are flipped from input gates of transistors 137 and 138 to output nodes 131 and 132.

With reference to offset stage 130, one or more mismatches in gain stage 140 may be compensated for by injection of current using offset stage 130. Current source 125 may be coupled between an amplifier ground 143 and an offset node 133. Current source 125 may be used to provide an injection offset current $I_{os}$, which may be divided by transconductance to output nodes 131 and 132 via transistors 129 and 128, respectively.

Transistors 128 and 129 of offset stage 130 may each have a source region couple to offset node 133. Transistor 128 may have a drain region coupled to output node 132, and transistor 129 may have a drain region coupled to output node 131. A positive side offset voltage ("Vos+") 126 may be provided to a gate of transistor 128, and a negative side offset voltage ("Vos−") 127 may be provided to a gate of transistor 129. Offset voltages 126 and 127 may be provided as an offset differential voltage 181. Offset differential voltage 181 may be a positive or negative voltage. Responsive to offset voltages 126 and 127, transistors 128 and 129 respectively transconduct offset currents respectively to output nodes 132 and 131 via offset injection branches 182 and 183, respectively. These currents may be the same or different for purposes of compensation.

Offset voltages 126 and 127 may be comparatively static as compared with high-speed differential signaling of input voltages 136 and 137. Offset voltages 126 and 127 may be used to balance a positive side output branch or node 131 and a negative side output branch or node 132 so as to have equal signal amplitudes above and below zero volts for a differential output signal 149 provided by output voltages 141 and 142. However, in another implementation, a different balance may be used. Offset voltages 126 and 127 may be initially set during calibration, and may be adjusted from time-to-time thereafter to compensate for changes in balance due to changes in environmental conditions.

Output nodes 131 and 132 may drive a differential output voltage 149 onto output lines, or other circuitry, which may have a capacitive load associated therewith. Load capacitance 124-1 coupled between output node 131 and a load ground 123 is used to model or represent a capacitive load on output node 131, and load capacitance 124-2 coupled between output node 132 and a load ground 123 is used to model or represent a capacitive load on output node 132. These are not actual discrete component capacitors of differential amplifier 120, but rather represent a capacitive load onto which a differential output signal 149 of output voltages 141 and 142 is driven by differential amplifier 120, such as driven by an ac-coupler circuit 180 in a high-pass range and a buffer amplifier circuit 190 in a low-pass range, and commonly driven by circuits 180 and 190 in a crossover range, as described below in additional detail.

Figure 5:
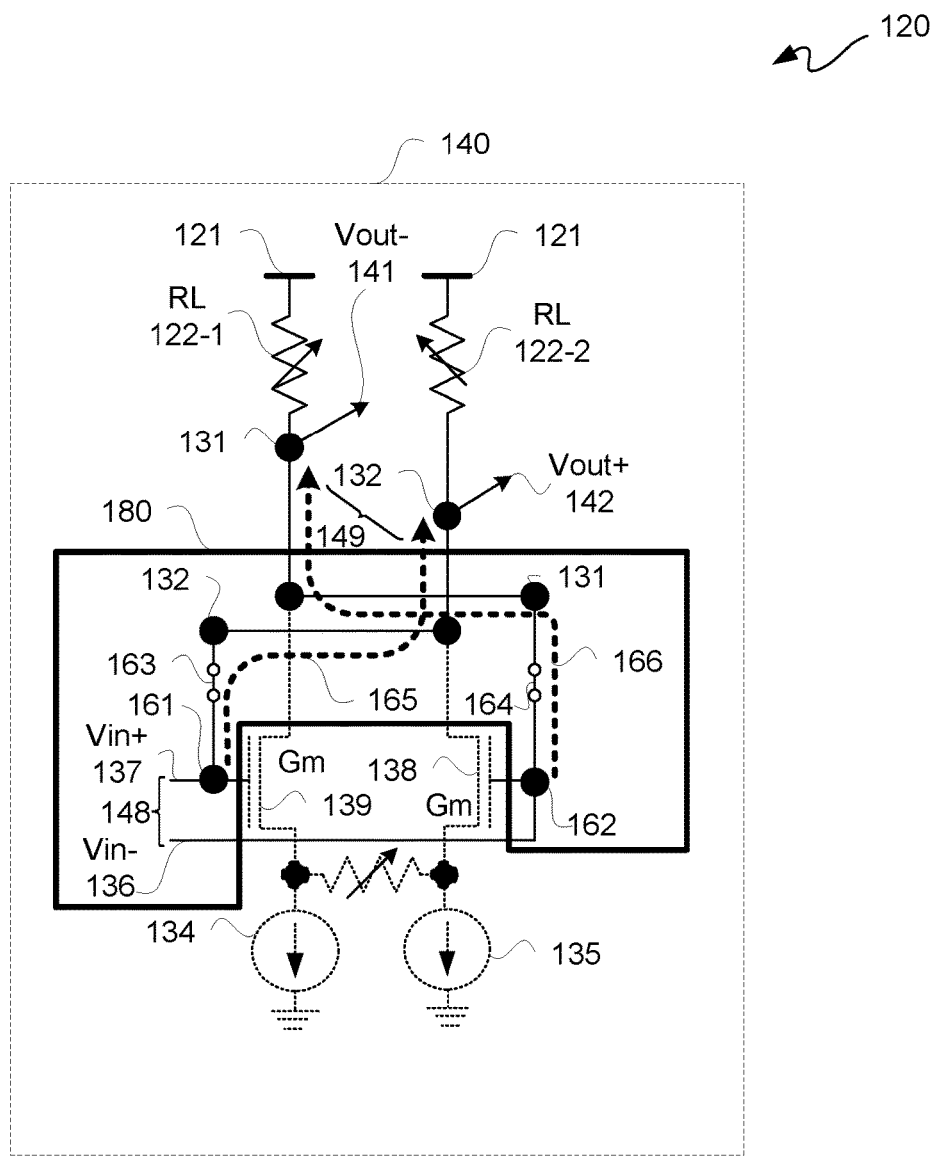
FIG. 5 is the schematic diagram illustratively depicting the exemplary bi-modal differential amplifier of FIG. 4 without an offset stage and without load capacitances for purposes of clarity and not limitation.

For purposes of clarity by way of example and not limitation, assuming injection currents are set to compensate for any imbalance in a differential voltage output signal 149 of gain stage 140, offset stage 130 may be removed as illustratively depicted in the schematic diagram of FIG. 5. FIG. 5 is the schematic diagram illustratively depicting an exemplary bi-modal differential amplifier 120 of FIG. 4 without offset stage 130 and without load capacitances 124 for purposes of clarity and not limitation. Additionally, in FIG. 5, bi-modal differential amplifier 120 is effectively illustratively depicted as being in a high-frequency range of operation for purposes of clarity and not limitation.

Along those lines, during a high-frequency range of operation, capacitance ("Cc") of each of ac-coupling capacitors 163 and 164 may be represented respectively as shorts 163 and 164. In this example, it is assumed that capacitance ("Cc") of ac-coupling capacitors 163 and 164 is equal. However, in another implementation, different capacitances may be used.

Because of ac-coupling capacitors-shorts 163 and 164 during operating in a high-frequency range, transistors 138 and 139, as well as circuitry coupled to sources nodes of transistors 138 and 139 is effectively bypassed, as generally indicated by having such bypassed circuitry illustratively depicted in phantom. In other words, power consumption previously associated with operation of transistors 138 and 139, as well as current sources 134 and 135 of a conventional differential amplifier is substantially reduced due to use of ac-coupling capacitors 163 and 164.

In a high-frequency mode of operation, a differential input voltage 148 applied to positive input voltage rail ("Vin+") 137 and negative input voltage rail ("Vin–") 136 are respectively directly conducted to "different side" output nodes 132 and 131 respectively along high-pass paths 165 and 166, namely a high-pass path. Accordingly, in a high-frequency mode of operation, Vin+ 137 is equal to Vout+ 142, and Vin– 136 is equal to Vout– 141. In other words, a differential input voltage 148 provided to input nodes 161 and 162 is directly conducted to "different side" output nodes 132 and 131, respectively, as a differential output voltage 149. By "different side", it is generally meant that there is a cross coupling of input nodes to output nodes in a high-frequency mode of operation. Without going into Maxwell's Equations, by "shorts" or "directly conducted", it is generally meant that rate of change of an input voltage signal in time is sufficiently fast to drive impedance toward zero for a capacitor.

Figure 6:
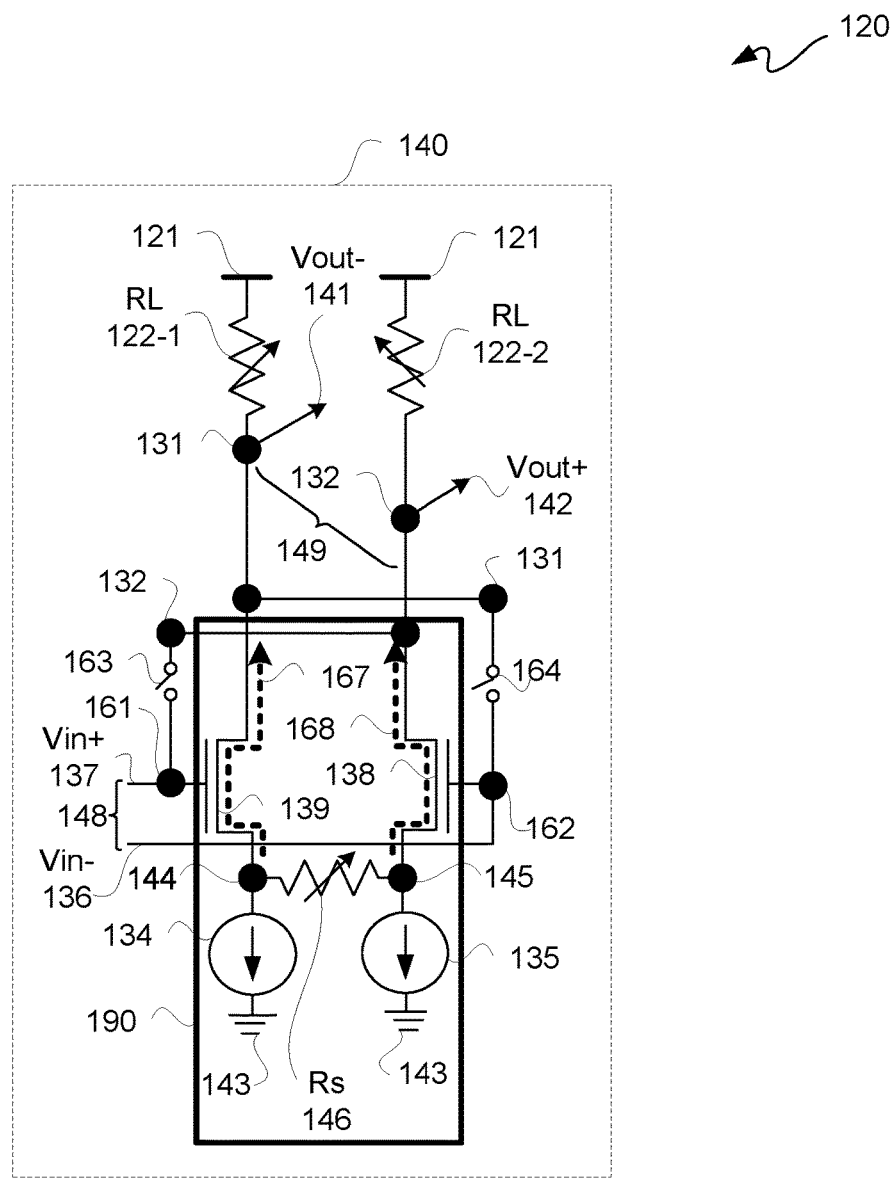
FIG. 6 is the schematic diagram illustratively depicting the exemplary bi-modal differential amplifier of FIG. 4 without an offset stage and without load capacitances for purposes of clarity and not limitation.

Again, for purposes of clarity by way of example and not limitation, assuming injection currents are set to compensate for any imbalance in a differential voltage output signal 149 of gain stage 140, offset stage 130 may be removed as illustratively depicted in the schematic diagram of FIG. 6. FIG. 6 is the schematic diagram illustratively depicting an exemplary bi-modal differential amplifier 120 of FIG. 4 without offset stage 130 and without load capacitances 124 for purposes of clarity and not limitation. Additionally, in FIG. 6, bi-modal differential amplifier 120 is effectively illustratively depicted as being in a low-frequency range of operation for purposes of clarity and not limitation.

Along those lines, during a low-frequency range of operation, capacitance ("Cc") of each of ac-coupling capacitors 163 and 164 may be represented respectively as opens 163 and 164 indicating an electrical capacitive decoupling between plates of each of ac-coupling capacitors 163 and 164. Again, in this example, it is assumed that capacitance ("Cc") of ac-coupling capacitors 163 and 164 is equal. However, in another implementation, different capacitances may be used.

Because of ac-coupling capacitors 163 and 164 being opens while operating in a low-frequency range, transistors 138 and 139, as well as circuitry coupled to source nodes of transistors 138 and 139 are operatively used. In other words, power consumption while operating at a low-frequency using ac-coupling capacitor-opens 163 and 164 in differential amplifier 120 is the same as in a conventional differential amplifier.

In a low-frequency mode of operation, a differential input voltage 148 applied to positive input voltage rail ("Vin+") 137 and negative input voltage rail ("Vin–") 136 are respectively directly conducted to gates of transistors 139 and 138 for transconductance respectively to output nodes 132 and 131 respectively along low-pass paths 167 and 168, namely a low-pass path. Accordingly, in a low-frequency mode of operation, Vin+ 137 is used to transconduct a current to a "same side" output node 131 to provide Vout– 141, and Vin– 136 is used to transconduct a current to a "same side" output node 131 to provide Vout– 142. In other words, a differential input voltage 148 provided to input nodes 161 and 162 is transconducted to output nodes 131 and 132, respectively, to provide as a differential output voltage 149. By "same side", it is generally meant that there is no cross coupling of input nodes to output nodes in a low-frequency mode of operation. Without going into Maxwell's Equations, by "opens" or "electrical capacitive decoupling", it is generally meant that rate of change of an input voltage signal in time is sufficiently slow to block signal propagation, namely to drive impedance toward infinity, for a capacitor.

To recapitulate, a decision threshold control circuit includes a low-pass path and a high-pass path. For such a low-pass path, a differential amplifier with offset injection branches is used to provide a decision threshold control function in a low-frequency range. For such a high-pass path, ac-coupling capacitors are used to provide a decision threshold control function for a high-frequency range. Use of such ac-coupling capacitors for a high-frequency range consumes less power than using a differential amplifier for such high-frequency range.

Because a cut-off frequency of such high and low paths is dependent upon output resistance and capacitance at output nodes, by combining such high and low paths in parallel, an "all-pass" decision threshold control circuit may be provided, namely a decision threshold control circuit spanning both high- and low-frequency ranges as well as a cross-over range between such high- and low-frequency ranges. As described above, an "all-pass" decision threshold control circuit consumes less power due to consuming less power for operation in a high-frequency range and consuming a same amount of power for operation in a low-frequency range. While there is a cross-over range between a high- and a low-frequency range, for purposes of clarity, a high-frequency range or high-pass range is generally used below to describe frequencies equal to or above a cutoff frequency, and a low-frequency range or low-pass range is generally used below to describe frequencies less than such a cutoff frequency, unless specifically delineated otherwise.

With simultaneous reference to FIGS. 4-6, an ac-coupler circuit 180 is formed of an ac-coupling capacitor 163 coupled between a positive side input node 161 and a positive side output node 132 and an ac-coupling capacitor 164 coupled between a negative side input node 162 and a negative side output node 131. Such ac-coupler circuit 180 is configured as a high-pass circuit path of high-pass paths 165 and 166. For ac-coupler circuit 180, positive side input node 161 is cross-coupled to positive side output node 132, and negative side input node 162 is cross-coupled to negative side output node 131.

A buffer amplifier circuit 190, namely a differential amplifier portion gain stage 140, includes current sources 134 and 135, source resistance 146, and transistors 138 and 139 coupled to input nodes 161 and 162 and to output nodes 131 and 132, as previously described. For buffer amplifier circuit 190, a positive side input node 161 may be same-side electrically coupled through a channel of transistor 139 to a negative side output node 131, and a negative side input node 162 may be same-side electrically coupled through a channel of transistor 138 to a positive side output node 132.

Buffer amplifier circuit 190 is thus coupled in parallel with ac-coupler circuit 180. Buffer amplifier circuit 190 is configured as a low-pass circuit path of low-pass paths 167 and 168. In contrast, ac-coupler circuit 180 bypasses amplifier buffer circuit 190 during a high-pass range and self-bypasses during a low-pass range.

Figure 7:
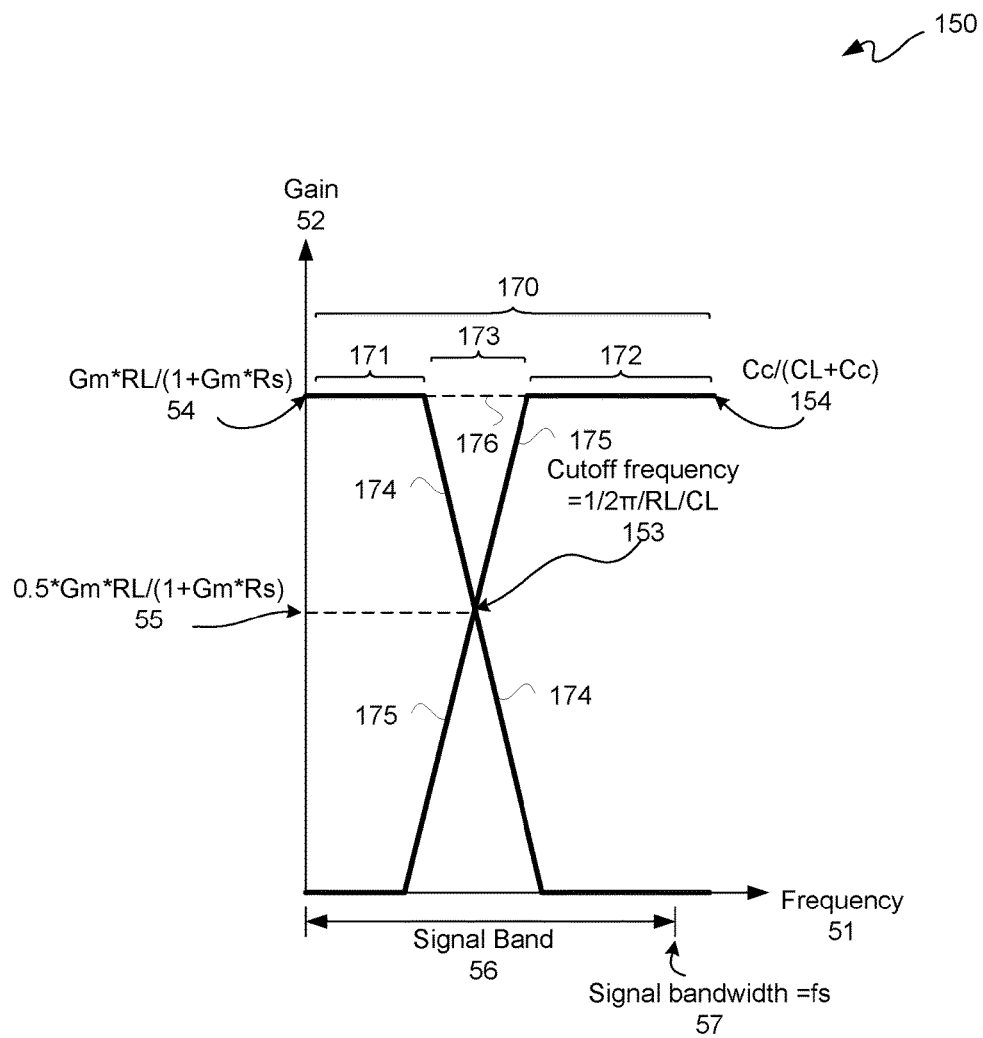
FIG. 7 is a signal diagram illustratively depicting an exemplary frequency response for the bi-modal differential amplifier of FIG. 4.

FIG. 7 is a signal diagram illustratively depicting an exemplary frequency response 150 for bi-modal differential amplifier 120 of FIG. 4. Frequency response 150 is plotted as frequency along an x-axis 51 versus gain along a y-axis 52. Generally, gain may be thought of as a ratio of output voltage Vout 149 to input voltage Vin 148.

A maximum gain 54 may be determined as before from the following equation Gm*RL/(1+Gm*RS), where Gm is transconductance of a transistor of gain stage 140 of differential amplifier 120, RL is resistance of a load resistance of gain stage 140 of differential amplifier 120, and Rs is resistance of gain stage 140 of differential amplifier 120. However, maximum gain 54 as determined in the above gain equation is only for operation during a low-frequency or low-pass range 171. For operation during a high-frequency or high-pass range 172, maximum gain 154 may be determined as Cc/(CL+Cc), where Cc is a capacitance of an ac-coupling capacitor, either of ac-coupling capacitors 163 or 164, and where CL is either of load capacitances 124-1 or 124-2, assuming equal values for ac-coupling capacitances and equal values for load capacitances for purposes of clarity by way of example and not limitation.

A cutoff frequency 153 may be determined from the following equation ½π/RL/CL, where RL is resistance of load resistance of gain stage 140 of differential amplifier 120, and where CL is capacitance of load capacitance of differential amplifier 120. Gain at cutoff frequency ("cutoff gain") 55 may be determined from the following equation 0.5*Gm*RL/(1+Gm*Rs), where Gm is transconductance of a transistor of gain stage 140 of differential amplifier 120, RL is resistance of a load resistance of gain stage 140 of differential amplifier 120, and Rs is resistance of gain stage 140 of differential amplifier 120. Thus, cutoff gain 55 is the same as before; however, while cutoff frequency 153 is determined by the same equation as before, cutoff frequency 153 is less than a sampling frequency, namely cutoff frequency 153 is within a signal band 56 of a signal bandwidth of a sampling frequency fs 57 of clock signal 99. One or more of capacitance values Cc and/or CL may be selected to have maximum gains 54 and 154 equal to one another, namely having matching gains for implementation of an "all-pass" decision threshold control circuit. Maximum gain 154 may be constant beyond a highest frequency of a signal band 56 of a signal of interest; however, for a higher sampling frequency, a cutoff frequency 153 would likewise be shifted higher.

In a conventional differential amplifier, cutoff frequency 53 is generally higher in frequency than a highest frequency of a signal band 56, namely a sampling frequency fs 57 in order to maintain sufficient gain throughout a signal band 56. However, in a conventional approach a minimum for a cutoff frequency 53 is equal to sampling frequency fs 57. Along those lines, a highest frequency of a signal band 56 is equal to sampling frequency fs 57, where sampling frequency fs 57 is a frequency of a clock signal 99 provided to samplers of FIGS. 1-1 through 1-3.

However, for differential amplifier 120, cutoff frequency 153 is less than sampling frequency fs 57. Assuming a frequency range for which gain is to be maintained is signal band 56, a signal band 56 is a frequency range for a signal of interest, such as a frequency of a differential input voltage signal 148 input to differential amplifier 120. Within a total frequency-gain curve 170 formed of a combination of frequency-gain curves 174 and 175, a gain for a frequency range at least of signal band 56 is to be maintained. In other words, total gain is equal to a sum of gains from each of frequency-gain curves 174 and 175. For a low-frequency range 171, total gain is generally only gain along gain curve 174, which is a maximum gain 54 in this example, and for a high-frequency range 172, total gain is generally only gain along gain curve 175, which is a maximum gain 154 in this example.

For a cross-over frequency or cross-over pass range 173 between frequency ranges 171 and 172, generally gains of each of frequency-gain curves 174 and 175 are added to obtain a total gain, which is a maximum gain 54 or 154 in this example. In other words, total frequency-gain curve 170 formed of a combination of frequency-gain curves 174 and 175 may be flat for at least a signal bandwidth of interest. In other words, frequency-gain curves 174 and 175 have corresponding fractions of a total gain for having a "flat" gain, as generally indicated by dashed line 176, across at least a signal bandwidth of interest. A maximum gain need not be used in other implementations, as a less than maximum gain may be used, namely where Rs is not equal to zero for example. By having input nodes 161 and 162 coupled to same polarity output nodes 132 and 131, respectively, for a high-pass range in a bypass mode and by having input nodes 161 and 162 coupled to opposite polarity output nodes 131 and 132, respectively, for a low-pass range in a self-bypass or transconductance mode, equal and opposite frequency-gain curves 174 and 175 may be obtained for design values selected to have maximum gains 54 and 154 equal to one another. More particularly, a low-frequency path gain (Gm*RL/(1+Gm*Rs)) may be at least coarsely tuned or adjusted to match Cc/(Cc+CL) to achieve flat gain across a signal band. Along those lines, a little difference between low-frequency gain and high frequency gain is tolerable because generally other receiver adaptation equalizes low-frequency and high frequency gains.

Cutoff frequency 153 is at the intersection of frequency-gain curves 174 and 175, which is at the level of cutoff gain 55. Bi-modal differential amplifier 120 may be implemented as a decision threshold control circuit 100 with offset injection branches for a sampler of any of samplers 110 of FIGS. 1-1 through 1-3 with a cutoff frequency 153 for such decisions less than as sampling frequency fs of sampling clock signal 99. Even though a signal with a clock pattern is assumed for a sampling signal for this implementation, a signal pattern other than a clock pattern may be used for a sampling signal in another implementation. Again, a decision threshold of differential amplifier 120 may be charged up to Ios*RL/Gm/RL*(1+Gm*Rs)=Ios/Gm*(1+GmRs), depending on values for offset voltages Vos− and Vos+, where Ios is an offset current of offset stage 130. However, values for RL and/or Gm may be different for differential amplifier 120 than a conventional differential amplifier as described below in additional detail.

Because a differential amplifier circuit portion of bi-modal differential amplifier 120 is not involved in a high-frequency range of operation, a bandwidth requirement of such differential amplifier circuit portion may be substantially reduced resulting in significantly less power consumption. Along those lines, frequency-gain curve 174 corresponds to operation of differential amplifier 120 associated with a low-pass path, and frequency-gain curve 175 corresponds to operation of differential amplifier 120 for a high-pass path. Accordingly, low-frequency bandwidth of differential amplifier 120 corresponds to cutoff frequency 153 of a low-pass path, where such cutoff frequency 153 does not need to be higher than a maximum operating frequency. For purposes of clarity by way of example and not limitation, if differential amplifier 120 handles only 10% of the total bandwidth during operation, a power savings of about 90% power compared with a conventional differential amplifier may be obtained.

By comparing frequency response in FIGS. 3 and 7, it may be seen that both cutoff frequencies 53 and 153 are determined by a same equation of ½π/RL/CL. However, cutoff frequency 153 is significantly lower than cutoff frequency 53. Along those lines, in the frequency response of FIG. 3, bandwidth of a conventional differential amplifier is at a minimum equal to ½π/RL/CL for such conventional implementation, where ½π/RL/CL has to be larger than the signal bandwidth, fs, for such implementation. In other words, for a conventional implementation, generally RL<1/CL/2/π/fs, which means RL has to be low and Gm has to be high to maintain the gain for a high-frequency range of operation, which leads to high power consumption.

However, for cutoff frequency 153 for a same sampling frequency fs and a same capacitive load CL, RL need not be as low and Gm need not be as high as in a conventional differential amplifier, as differential amplification portion of differential amplifier 120 effectively need only cover a low-frequency range and a portion of a cross-over frequency range.

With additional reference to FIGS. 4-6, ratios of load and ac-coupler circuit 180 capacitances may be sized to match DC gain of buffer amplifier circuit 190. In other words, for a low-frequency range 171 and a high-frequency range 172, buffer amplifier circuit 190 gain and ac-coupler circuit 180 gain respectively equal one another. For purposes of clarity by way of example and not limitation, for the above-described implementations, a cross-over frequency range 173 may be approximately 0.1 to 1.0 MHz on a low-frequency end of such range and approximately 10 to 100 MHz on a high-frequency end of such range. Along those lines, a low-frequency range 171 may be from 0 Hz to approximately 0.1 to 1.0 MHz, and a high-frequency range 172 may be from approximately 10 to 100 MHz and higher.

With simultaneous reference to FIG. 1-2 and FIGS. 4 through 7, different reference voltage inputs may be provided to samplers 110H, 110M and 110L for respectively setting decision thresholds 103H, 103M and 103L. Such a reference voltage inputs may be provided as a separate offset differential voltage 181, namely offset voltages 126 and 127, for a bi-modal differential amplifier 120 implemented as a decision threshold control circuit 100. Along those lines, there may be an offset differential voltage 181H, 181M and 181L corresponding to setting decision thresholds 103H, 103M and 103L. Along those lines, offset injection branches 182 and 183 are physically and electrically coupled to output nodes 132 and 131, respectively, in each of ranges 171, 172, and 173. Because offset differential voltage 181 is essentially static once adjusted, such offset differential voltage 181 provides a DC offset voltage throughout ranges 171, 172, and 173, namely across frequencies of a signal band. Reference voltages 181 may be set independent of sampling frequency and independent of an input signal.

Along those lines, for samplers 110H, 110M and 110L, three different offset differential voltages 181H, 181M and 181L may be for respectively setting decision thresholds 103H, 103M and 103L, and these offset differential voltages 181H, 181M and 181L may be independent of a common input differential voltage 148 for received signal 101. This allows samplers 110H, 110M and 110L to be commonly coupled to receive an input differential voltage 148 as a received signal 101, as such input differential voltage 148 and offset differential voltage 181 are independent of one another.

Figure 8:
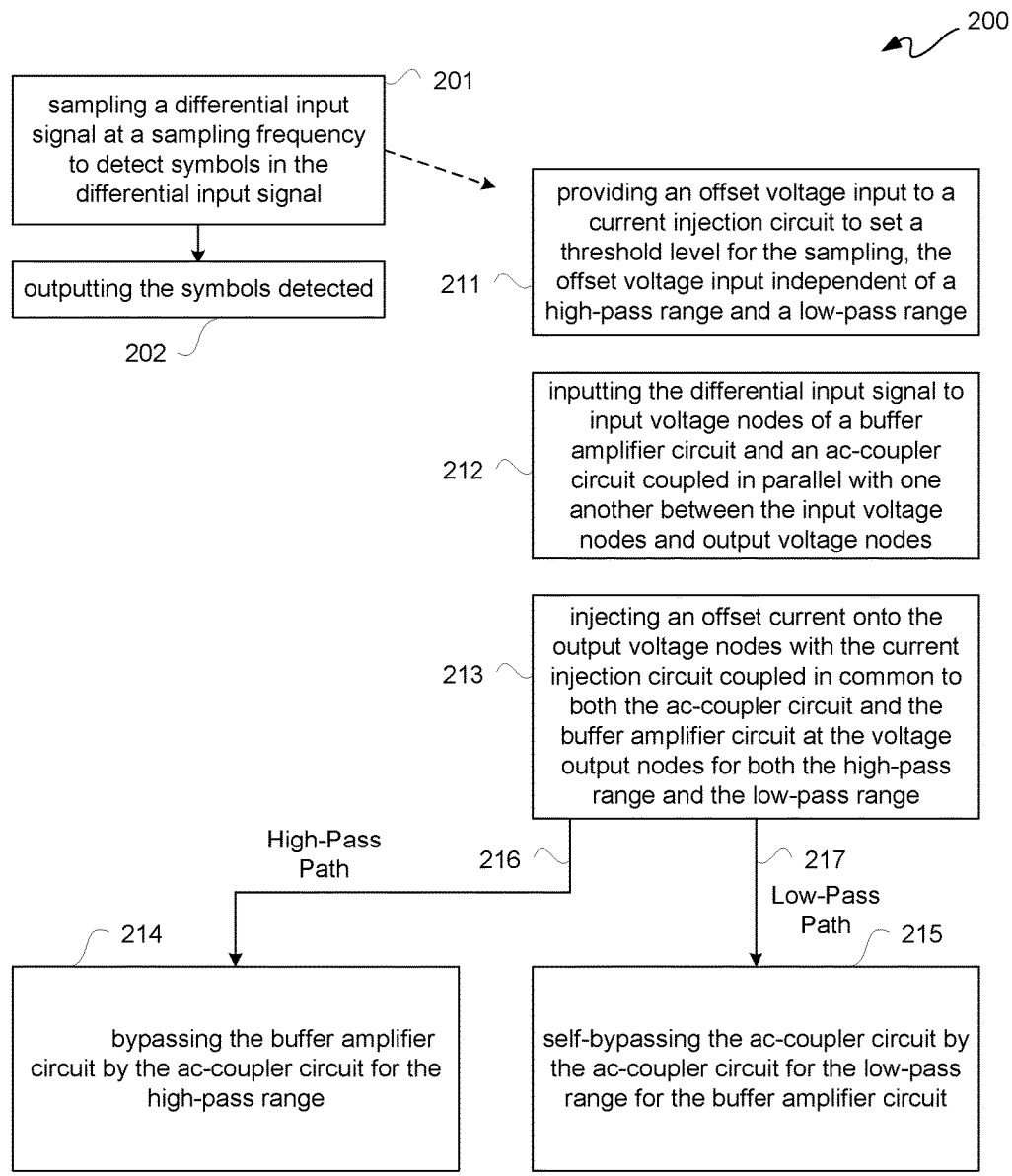
FIG. 8 is a flow diagram illustratively depicting an exemplary sampling flow.
Figure 9:
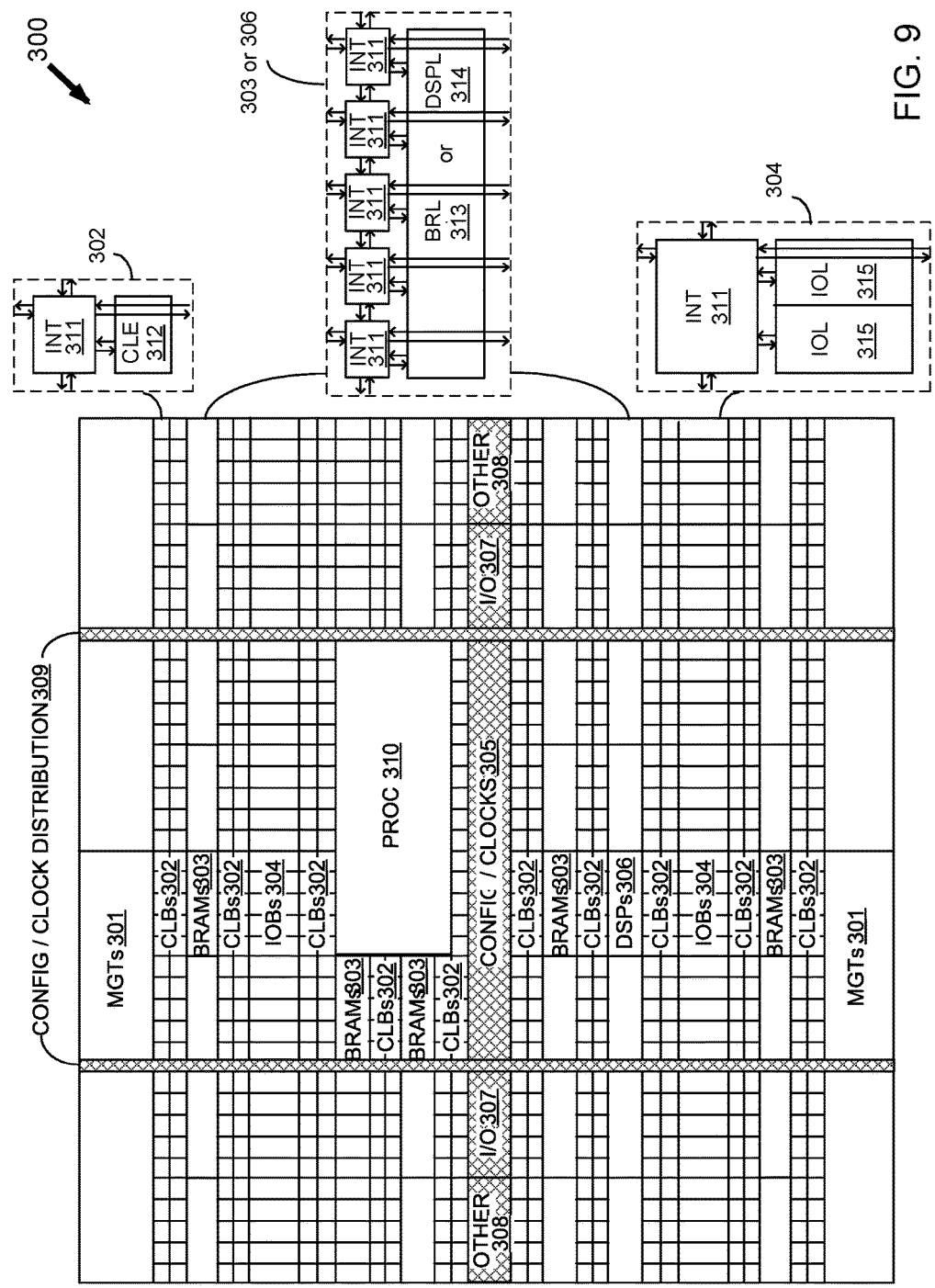
FIG. 9 is a simplified block diagram depicting an exemplary columnar Field Programmable Gate Array ("FPGA") architecture.

FIG. 8 is a flow diagram illustratively depicting an exemplary sampling flow 200. Sampling flow 200 is further described with simultaneous reference to FIGS. 4-8.

In sampling flow 200, at 201 a differential input signal is sampled by a sampler 110 at a sampling frequency fs 57 to detect symbols in such differential input signal, such as differential input signal 148. At 202, symbols detected at 201 may be output.

Operations 211-215 may be used for sampling at 201 in accordance with the above description. At 211, an offset voltage input 181 may be provided to a current injection circuit, such as offset stage 130, to set a threshold level 103 for sampling at 201. Such offset voltage input 181 may be set and used independently of a high-pass range 172 and a low-pass range 171.

At 212, differential input signal 148 may be input to input voltage nodes 161 and 162 of a buffer amplifier circuit 190 and an ac-coupler circuit 180 coupled in parallel with one another between input voltage nodes 161 and 162 and output voltage nodes 131 and 132. At 213, an offset current may be injected onto output voltage nodes 131 and 132 with a current injection circuit such as offset stage 130 coupled in common to both ac-coupler circuit 180 and buffer amplifier circuit 190 at voltage output nodes 131 and 132 for both high-pass range 172 and low-pass range 171.

For a high-pass path 216 invoked by frequency of differential input signal 148 being in a high-frequency range 172, buffer amplifier circuit 190 is bypassed at 214 by ac-coupler circuit 180 for high-pass range 172. Such bypassing at 214 includes directly conducting differential input signal 148 from input voltage nodes 161 and 162 to output voltage nodes 132 and 131, respectively, through ac-coupler circuit 180 having a frequency-gain curve 175.

For a low-pass path 217 invoked by frequency of differential input signal 148 being in a low-frequency range 171, ac-coupler circuit self-bypasses at 215 for a low-pass range 171 in favor of operation of buffer amplifier circuit 190. Such self-bypassing includes transconducting differential input signal 148 from input voltage nodes 161 and 162 to output voltage nodes 131 and 132, respectively, through buffer amplifier circuit 190 having a frequency-gain curve 174.

Because one or more of the examples described herein may be implemented in an FPGA, a detailed description of such an IC is provided. However, it should be understood that other types of ICs may benefit from the technology described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 3 illustrates an FPGA architecture 300 that includes a large number of different programmable tiles including multi-gigabit transceivers ("MGTs") 301, configurable logic blocks ("CLBs") 302, random access memory blocks ("BRAMs") 303, input/output blocks ("IOBs") 304, configuration and clocking logic ("CONFIG/CLOCKS") 305, digital signal processing blocks ("DSPs") 306, specialized input/output blocks ("I/O") 307 (e.g., configuration ports and clock ports), and other programmable logic 308 such as digital clock managers, analog-to-digital converters, system monitoring logic, and so forth. Some FPGAs also include dedicated processor blocks ("PROC") 310.

In some FPGAs, each programmable tile includes a programmable interconnect element ("INT") 311 having standardized connections to and from a corresponding interconnect element in each adjacent tile. Therefore, the programmable interconnect elements taken together implement the programmable interconnect structure for the illustrated FPGA. The programmable interconnect element 311 also includes the connections to and from the programmable logic element within the same tile, as shown by the examples included at the top of FIG. 3.

For example, a CLB 302 can include a configurable logic element ("CLE") 312 that can be programmed to implement user logic plus a single programmable interconnect element ("INT") 311. A BRAM 303 can include a BRAM logic element ("BRL") 313 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 306 can include a DSP logic element ("DSPL") 314 in addition to an appropriate number of programmable interconnect elements. An 10B 304 can include, for example, two instances of an input/output logic element ("IOL") 315 in addition to one instance of the programmable interconnect element 311. As will be clear to those of skill in the art, the actual I/O pads connected, for example, to the I/O logic element 315 typically are not confined to the area of the input/output logic element 315.

In the pictured embodiment, a horizontal area near the center of the die (shown in FIG. 3) is used for configuration, clock, and other control logic. Vertical columns 309 extending from this horizontal area or column are used to distribute the clocks and configuration signals across the breadth of the FPGA.

Some FPGAs utilizing the architecture illustrated in FIG. 3 include additional logic blocks that disrupt the regular columnar structure making up a large part of the FPGA. The additional logic blocks can be programmable blocks and/or dedicated logic. For example, processor block 310 spans several columns of CLBs and BRAMs.

Note that FIG. 3 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 3 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing describes exemplary apparatus(es) and/or method(s), other and further examples in accordance with the one or more aspects described herein may be devised without departing from the scope hereof, which is determined by the claims that follow and equivalents thereof. Claims listing steps do not imply any order of the steps. Trademarks are the property of their respective owners.

What is claimed is:

1. An apparatus for decision threshold control, comprising:
   an alternating current coupler ("ac-coupler") circuit configured as a high-pass circuit path for a first frequency range;
   a buffer amplifier circuit coupled in parallel with the ac-coupler circuit and configured as a low-pass circuit path for a second frequency range; and
   an offset injection circuit coupled to both the ac-coupler circuit and the buffer amplifier circuit and configured to inject an offset.

2. The apparatus according to claim 1, wherein:
   the ac-coupler circuit has a first gain;
   the buffer amplifier circuit has a second gain;
   the second frequency range is lower than the first frequency range;
   the first frequency range and the second frequency range are separated from one another by a cross-over frequency range; and
   the offset injection circuit commonly coupled to inject the offset into the ac-coupler circuit and the buffer amplifier circuit.

3. The apparatus according to claim 2, wherein:
   the first gain and the second gain are configured to be equal to one another;
   the second gain is at least equal to $Gm*RL/(1+Gm*Rs)$ for Rs and Gm respectively a source resistance and a transconductance of the buffer amplifier circuit and for RL a load resistance; and
   the first gain is at least equal to $Cc/(CL+Cc)$ for Cc a capacitance of the ac-coupler circuit and for CL a capacitive load driven in common by the ac-coupler circuit and the buffer amplifier circuit.

4. The apparatus according to claim 2, wherein:
   the ac-coupler circuit has a first frequency-gain curve;
   the buffer amplifier circuit has a second frequency-gain curve opposite and equal to the first frequency gain-curve; and
   a combination of the first frequency-gain curve and the second frequency-gain curve provide a total gain equal to the first gain.

5. The apparatus according to claim 2, wherein:
   the ac-coupler circuit has a first frequency-gain curve;
   the buffer amplifier circuit has a second frequency-gain curve;
   the first frequency-gain curve and the second frequency-gain curve cross-over one another at a cutoff frequency in the cross-over frequency range; and
   the cutoff frequency is less than a sampling frequency.

6. The apparatus according to claim 1, wherein the ac-coupler circuit is configured to bypass the buffer amplifier circuit for the first frequency range and configured for self-bypassing for the second frequency range.

7. The apparatus according to claim 6, wherein the high-pass circuit path and the low-pass circuit path are coupled in parallel between input voltage nodes and output voltage nodes common to both the ac-coupler circuit and the buffer amplifier circuit.

8. The apparatus according to claim 7, wherein the offset injection circuit is coupled to the output voltage nodes and configured for receiving a reference voltage for injection of the offset to the output voltage nodes.

9. The apparatus according to claim 8, wherein:
   a first capacitively coupled branch of the high-pass circuit path is coupled between a positive-side input voltage node of the input voltage nodes and a positive-side output voltage node of the output voltage nodes;
   a second capacitively coupled branch of the high-pass circuit path is coupled between a negative-side input voltage node of the input voltage nodes and a negative-side output voltage node of the output voltage nodes;
   a first gate-to-drain path of the low-pass circuit path is coupled between the positive-side input voltage node of the input voltage nodes and the negative-side output voltage node of the output voltage nodes; and
   a second gate-to-drain path of the low-pass circuit path is coupled between the negative-side input voltage node of the input voltage nodes and the positive-side output voltage node of the output voltage nodes.

10. The apparatus according to claim 7, wherein the ac-coupler circuit comprises:
    a first capacitor coupled between a positive-side input voltage node of the input voltage nodes and a positive-side output voltage node of the output voltage nodes; and
    a second capacitor coupled between a negative-side input voltage node of the input voltage nodes and a negative-side output voltage node of the output voltage nodes.

11. A system for signal sampling, comprising:
    a sampler configured to receive a received signal and to detect symbols in the received signal;
    a decision threshold control circuit of the sampler including a bi-modal differential amplifier, the bi-modal differential amplifier having a current amplifier circuit and an offset injection circuit coupled to one another at voltage output nodes;
    the current amplifier circuit having voltage input nodes configured for receiving the received signal; and
    the offset injection circuit configured to receive an offset input voltage.

12. The system according to claim 11, wherein the current amplifier circuit comprises:
    an alternating current coupler ("ac-coupler") circuit configured as a high-pass circuit path for a first frequency range;
    a buffer amplifier circuit coupled in parallel with the ac-coupler circuit, the buffer amplifier circuit configured as a low-pass circuit path for a second frequency range; and
    the offset injection circuit coupled to both the ac-coupler circuit and the buffer amplifier circuit at the voltage output nodes and configured to inject an offset current to the voltage output nodes.

13. The system according to claim 12, wherein:
the ac-coupler circuit has a first gain;
the buffer amplifier circuit has a second gain;
the second frequency range is lower than the first frequency range; and
the first frequency range and the second frequency range are separated from one another by a cross-over frequency range.

14. The system according to claim 13, wherein:
the first gain and the second gain are configured to be equal to one another;
the second gain is at least equal to $Gm*RL/(1+Gm*Rs)$ for Rs and Gm respectively a source resistance and a transconductance of the buffer amplifier circuit and for RL a load resistance; and
the first gain is at least equal to $Cc/(CL+Cc)$ for Cc a capacitance of the ac-coupler circuit and for CL a capacitive load driven in common by the ac-coupler circuit and the buffer amplifier circuit.

15. The system according to claim 13, wherein:
the ac-coupler circuit has a first frequency-gain curve;
the buffer amplifier circuit has a second frequency-gain curve equal and opposite to the first frequency-gain curve; and
a combination of the first frequency-gain curve and the second frequency-gain curve provide a total gain equal to the first gain.

16. The system according to claim 13, wherein:
the ac-coupler circuit has a first frequency-gain curve;
the buffer amplifier circuit has a second frequency-gain curve;
the first frequency-gain curve and the second frequency-gain curve cross-over one another at a cutoff frequency in the cross-over frequency range; and
the cutoff frequency is less than a sampling frequency of the sampler.

17. The system according to claim 12, wherein the sampler and the offset input voltage respectively are a first sampler and a first offset input voltage, the system further comprising:
a second sampler and a third sampler each configured as the first sampler;
the first sampler, the second sampler and the third sampler commonly coupled to receive the received signal;
the first sampler configured to detect the symbols in the received signal above a first threshold;
the second sampler configured to detect the symbols in the received signal below the first threshold and above a second threshold;
the third sampler configured to detect the symbols in the received signal below the second threshold and above a third threshold;
the offset injection circuit of the first sampler configured to receive the first offset input voltage for setting the first threshold;
the offset injection circuit of the second sampler configured to receive a second offset input voltage for setting the second threshold; and
the offset injection circuit of the third sampler configured to receive a third offset input voltage for setting the third threshold.

\* \* \* \* \*